(12) United States Patent
Mitsui

(10) Patent No.: US 9,759,496 B2
(45) Date of Patent: Sep. 12, 2017

(54) HEAT SINK, HEAT DISSIPATING STRUCTURE, COOLING STRUCTURE AND DEVICE

(71) Applicant: NEC Corporation, Tokyo (JP)

(72) Inventor: Tomoyuki Mitsui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 15/074,176

(22) Filed: Mar. 18, 2016

(65) Prior Publication Data
US 2016/0278236 A1  Sep. 22, 2016

(30) Foreign Application Priority Data
Mar. 20, 2015  (JP) .................. 2015-057403

(51) Int. Cl.
*H05K 7/20* (2006.01)
*F28F 13/14* (2006.01)
(Continued)

(52) U.S. Cl.
CPC ............... *F28F 13/14* (2013.01); *F28F 3/02* (2013.01); *G06F 1/20* (2013.01); *H01L 23/467* (2013.01); *F28F 2215/04* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

2004/0190249 A1* 9/2004 Hasegawa .......... H05K 7/20563
361/697
2006/0162901 A1* 7/2006 Aizono .................... G06F 1/203
165/80.4
(Continued)

FOREIGN PATENT DOCUMENTS

JP  57-201846  12/1982
JP  61-129349  8/1986
(Continued)

OTHER PUBLICATIONS

Japanese Office Action mailed Apr. 26, 2016, by the Japanese Patent Office in counterpart Japanese Patent Application No. 2015-057403.
(Continued)

*Primary Examiner* — Anthony Haughton
*Assistant Examiner* — Razmeen Gafur
(74) *Attorney, Agent, or Firm* — Finnegan, Henderson, Farabow, Garrett & Dunner, L.L.P.

(57) ABSTRACT

In order to suppress an increase in the temperature of a leeward heat sink without increasing cost, a heat dissipating structure 140 according to the present invention includes a plurality of regions arranged along the direction of airflow from an air blower unit 150, wherein the regions are arranged in descending order of thermal resistance in each region, from windward to leeward.

16 Claims, 3 Drawing Sheets

(51) Int. Cl.
*F28F 3/02* (2006.01)
*G06F 1/20* (2006.01)
*H01L 23/467* (2006.01)

(56) References Cited

U.S. PATENT DOCUMENTS

| | | | | |
|---|---|---|---|---|
| 2006/0244126 A1* | 11/2006 | Shibamoto | | G11C 5/00 257/706 |
| 2007/0187069 A1* | 8/2007 | Ueno | | F28D 15/0275 165/80.3 |
| 2007/0234741 A1* | 10/2007 | Lee | | G06F 1/20 62/3.2 |
| 2008/0017350 A1* | 1/2008 | Hwang | | H01L 23/3672 165/80.3 |
| 2008/0023176 A1* | 1/2008 | Peng | | F04D 29/582 165/80.3 |
| 2008/0023189 A1* | 1/2008 | Kimura | | F28F 3/02 165/185 |
| 2008/0130230 A1* | 6/2008 | Yu | | F28D 15/0233 361/700 |
| 2008/0158812 A1* | 7/2008 | Erturk | | G06F 1/20 361/679.31 |
| 2009/0046428 A1* | 2/2009 | Hung | | F28D 15/0233 361/697 |
| 2010/0282443 A1* | 11/2010 | Guo | | F28D 15/0275 165/104.26 |
| 2012/0199336 A1* | 8/2012 | Hsu | | F28F 3/022 165/185 |
| 2012/0201036 A1* | 8/2012 | Hsu | | F21V 29/83 362/373 |
| 2012/0268890 A1* | 10/2012 | Stock | | G06F 1/20 361/679.53 |
| 2012/0299801 A1* | 11/2012 | Kitano | | F21V 5/007 345/32 |
| 2013/0032322 A1* | 2/2013 | Hsu | | F28F 3/02 165/185 |
| 2013/0032323 A1* | 2/2013 | Hsu | | F28F 3/02 165/185 |
| 2013/0094150 A1* | 4/2013 | Shinomiya | | H02M 7/003 361/710 |
| 2013/0112373 A1* | 5/2013 | Fukai | | H01L 23/427 165/104.21 |
| 2013/0188314 A1* | 7/2013 | Matsunaga | | H01L 23/427 361/698 |
| 2013/0188315 A1* | 7/2013 | Konishide | | H05K 7/20336 361/700 |
| 2014/0334093 A1* | 11/2014 | Wei | | G06F 1/20 361/679.47 |
| 2015/0068719 A1* | 3/2015 | Lu | | F28F 3/02 165/185 |
| 2015/0216074 A1* | 7/2015 | Nishihara | | H01L 23/367 361/704 |

FOREIGN PATENT DOCUMENTS

| | | |
|---|---|---|
| JP | 8-222672 | 8/1996 |
| JP | 2001-24122 | 1/2001 |
| JP | 2002-314278 | 10/2002 |
| JP | 2003-188321 | 7/2003 |
| JP | 56-89873 | 3/2015 |

OTHER PUBLICATIONS

Japanese Office Action mailed Aug. 30, 2016, by the Japanese Patent Office in counterpart Japanese Patent Application No. 2015-057403.

Japanese Office Action mailed Dec. 20, 2016, by the Japanese Patent Office in counterpart Japanese Patent Application No. 2015-057403.

Office Action issued by the Japanese Patent Office in counterpart Japanese Patent Application No. 2015-057403 dated May 9, 2017.

* cited by examiner

HEAT SINK, HEAT DISSIPATING STRUCTURE, COOLING STRUCTURE AND DEVICE

This application is based upon and claims the benefit of priority from Japanese Patent Application No. 2015-057403, filed on Mar. 20, 2015, the disclosure of which is incorporated herein in its entirety by reference.

TECHNICAL FIELD

The present invention relates to a heat sink, a heat dissipating structure, a cooling structure and a device.

BACKGROUND ART

Devices (for example, electronic devices) such as personal computers have been enhanced in recent years. Accordingly, a plurality of integrated circuits are disposed on a circuit board of an electronic device. The integrated circuits have the property of generating heat when they are in operation. A technique that uses heat sinks and a fan or fans to dissipate heat generated by a plurality of integrated circuits is generally known. Specifically, according to the technique, heat sinks are placed on a plurality of integrated circuits and heat generated by the plurality of integrated circuits are dissipated by the heat sinks. According to the technique, the heat sinks are cooled by blowing air from a fan or fans. The technique thus makes it easier to transfer heat generated by the plurality of integrated circuits to the heat sinks, thereby enhancing the effect of dissipating heat generated by the plurality of integrated circuits.

Electronic devices have been enhanced in performance and decreased in size. Accordingly, in the technique using heat sinks and a fan or fans mentioned above, it is desired to use a single fan to blow air to heat sinks. In such an implementation, air is usually blown in the direction in which fins of the heat sinks extend and therefore the temperature of the leeward side of heat sinks is higher than the temperature of the windward side of the heat sinks. This is because air from the fan is directly sent to the windward side and air heated in the windward side is sent to the leeward side. This degrades the performance for cooling integrated circuits located in the leeward side. It is therefore desired to prevent degradation of the performance for cooling integrated circuits located even in the leeward side.

As a technique for preventing degradation of the performance for cooling even the leeward side, Japanese Laid-open Patent Publication No. 8-222672 (PTL1) discloses a technique relating to a cooling structure for a semiconductor module. The technique disclosed in PTL1 provides a plurality of heat sinks. In the technique described in PTL1, the plurality of heat sinks are disposed along an air flow path. The technique described in PTL1 uses heat pipes to keep the temperature of a first heat sink, a second heat sink and a third heat sink constant.

SUMMARY

However, the technique descried in PTL1 requires the use of a number of heat pipes in proportion to the number of heat sinks. Therefore, according to the technique described in PTL1, the cost increases with an increasing number of heat pipes.

In light of the existing circumstances, an object of the present invention is to provide heat sinks, a heat dissipating structure, a cooling structure and a device that are capable of suppressing an increase in the temperature of a heat sink located on the leeward side without increasing cost.

To achieve the object mentioned above, a heat sink according to the present invention includes a plurality of regions along the direction of airflow from an air blower unit and is formed in such a way that the regions are arranged in descending order of thermal resistance, from windward to leeward.

To achieve the object mentioned above, a heat dissipating structure according to the present invention includes a first heat sink along the direction of airflow from an air blower unit and a second heat sink located on the leeward side of the first heat sink and is formed in such a way that the second heat sink has a thermal resistance lower than the first heat sink.

To achieve the object mentioned above, a heat sink according to the present invention is disposed on the windward side of another heat sink along the direction of airflow from an air blower unit and is formed in such a way as to have a higher thermal resistance than the other heat sink mentioned above.

To achieve the object mentioned above, a heat sink according to the present invention is disposed on the leeward side of another heat sink along the direction of airflow from an air blower unit and is formed in such a way as to have a lower thermal resistance than the other heat sink mentioned above.

To achieve the object mentioned above, a cooling structure according to the present invention is formed to include the heat sinks mentioned above and the air blower unit mentioned above.

To achieve the object mentioned above, a device according to the present invention is formed to include the cooling structure mentioned above and heat generating elements thermally coupled to the cooling structure mentioned above.

Advantageous Effects of the Invention

According to the present invention, an increase in the temperature of a leeward heat sink can be suppressed without increasing cost.

EXEMPLARY EMBODIMENTS

Exemplary embodiments of the present invention will be described below with reference to the drawings.

First Exemplary Embodiment

Figure 1:
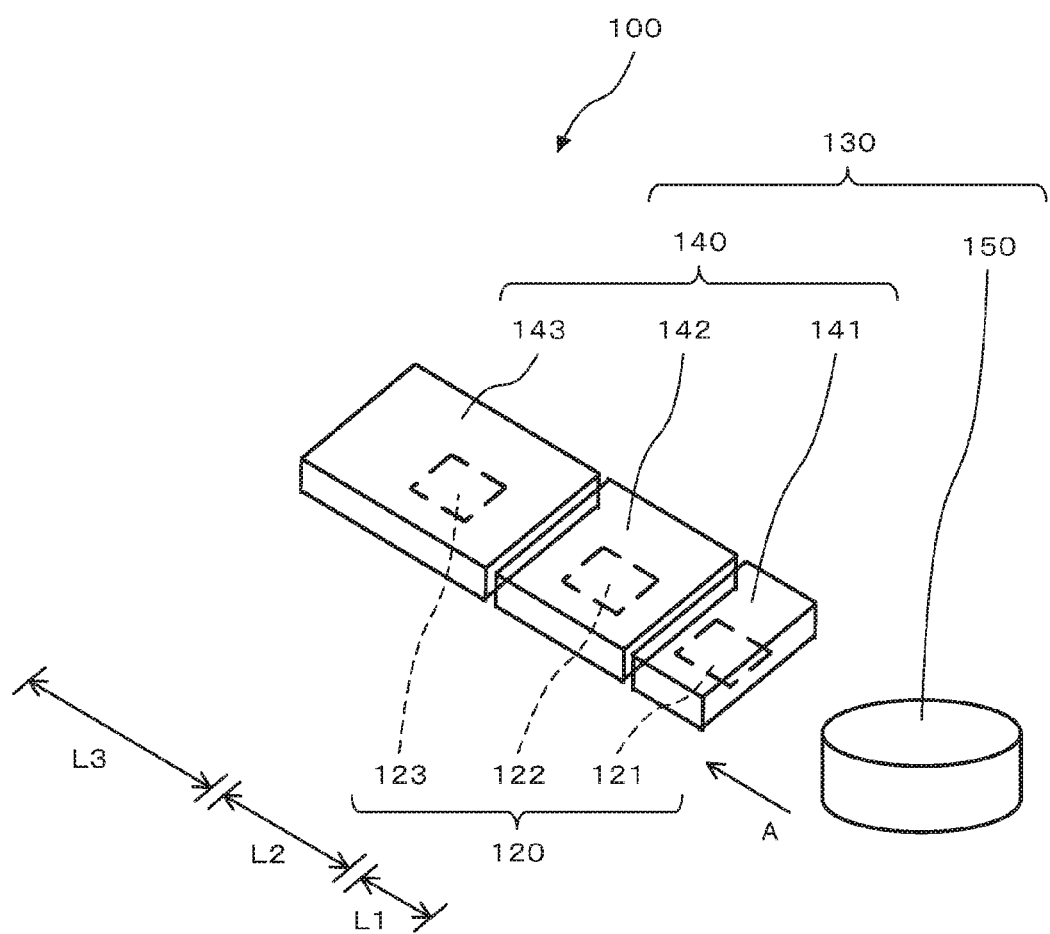
FIG. 1 is a perspective view illustrating a configuration of heat sinks, a cooling structure and an electronic device (a device) according to one exemplary embodiment (a first exemplary embodiment) of the present invention.

An exemplary embodiment (a first exemplary embodiment) of the present invention will be described with reference to FIG. 1. FIG. 1 is a perspective view illustrating a configuration of a heat dissipating structure 140, a cooling structure 130 and an electronic device (a device) 100 according to this exemplary embodiment (the first exemplary embodiment).

The electronic device 100 includes heat generating elements 120 and a cooling structure 130. The heat generating elements 120 are integrated circuits such as CPU, IC, LSI, or MPU, for example, which are well known from the prior art and therefore will be only briefly described and detailed descriptions thereof will be omitted. The heat generating elements 120 generate heat when they are in operation. The cooling structure 130 is thermally coupled to the heat generating elements 120 in order to dissipate heat generated by the heat generating elements 120. "IC" is an abbreviation of "Integrated Circuit". "LSI" is an abbreviation of "Large Scale Integration". "CPU" is an abbreviation of "Central Processing Unit". "MPU" is an abbreviation of "Micro Processing Unit".

The cooling structure 130 includes a heat dissipating structure 140 and an air blower unit 150. The heat dissipating structure 140 includes a plurality of regions (a first heat sink 141, a second heat sink 142 and a third heat sink 143) along the direction of airflow from the air blower unit 150. The heat dissipating structure 140 is formed in such a way that the plurality of regions are arranged in descending order of thermal resistance, from windward to leeward, along the airflow direction A from the air blower unit 150.

The thermal resistance of the heat dissipating structure 140 can be calculated as 1/(thermal conductivity of material×total of front and back surface areas of fins). Therefore, in order to reduce the thermal resistance of the leeward side, the regions may be arranged in ascending order of length (L1, L2, and L3 illustrated in FIG. 1), for example, from windward to leeward, along the direction of airflow. This allows the front and back surface area of the fins on the leeward side to be increased, thereby reducing the heat resistance of the leeward side without increasing the number of parts.

The heat dissipating structure 140 of this exemplary embodiment thus can suppress an increase in the temperature of the leeward side of the heat dissipating structure 140 without increasing cost. Similarly, the cooling structure of this exemplary embodiment can suppress an increase in the temperature of the leeward side of the heat dissipating structure 140 without increasing cost. Similarly, the electronic device 100 including the heat dissipating structure 140 can suppress an increase in the temperature of the leeward side of the heat dissipating structure 140 without increasing cost.

Second Exemplary Embodiment

Figure 2:
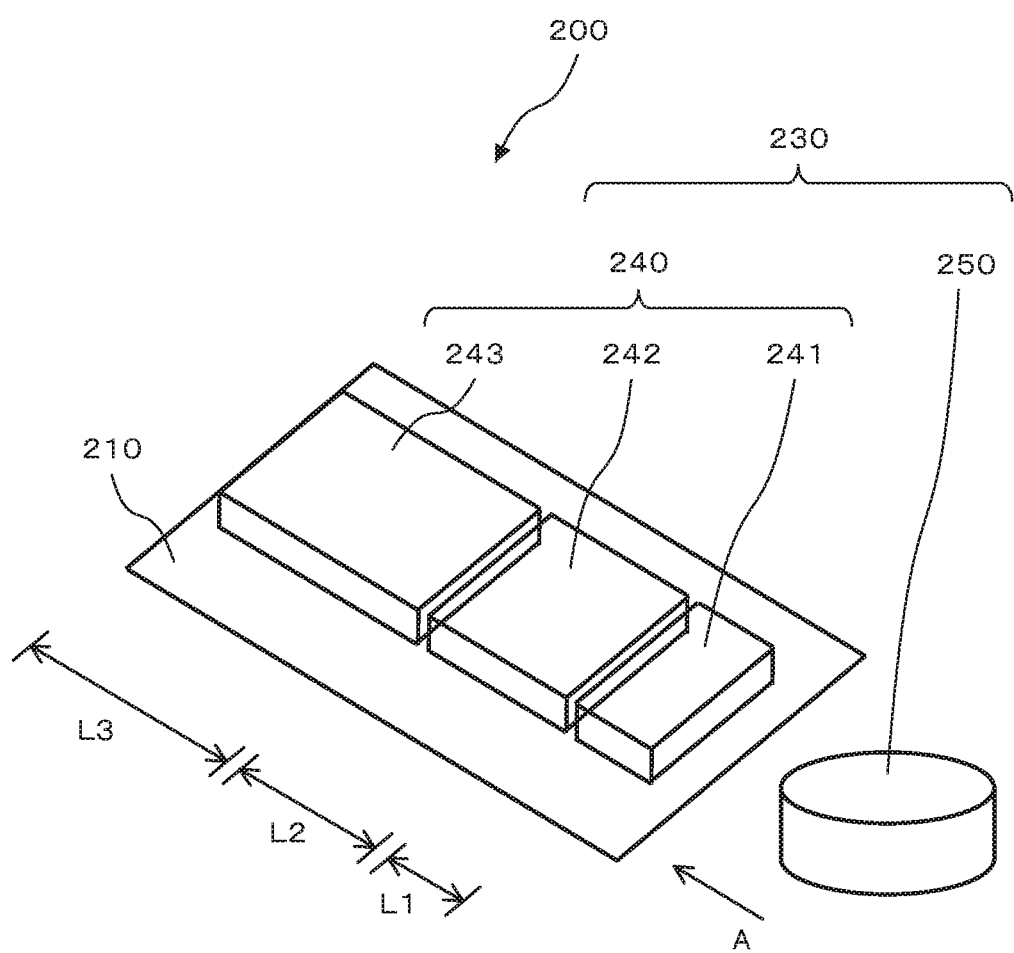
FIG. 2 is a perspective view illustrating a configuration of heat sinks, a cooling structure and an electronic device (a device) according to an alternative exemplary embodiment (a second exemplary embodiment) of the present invention.
Figure 3:
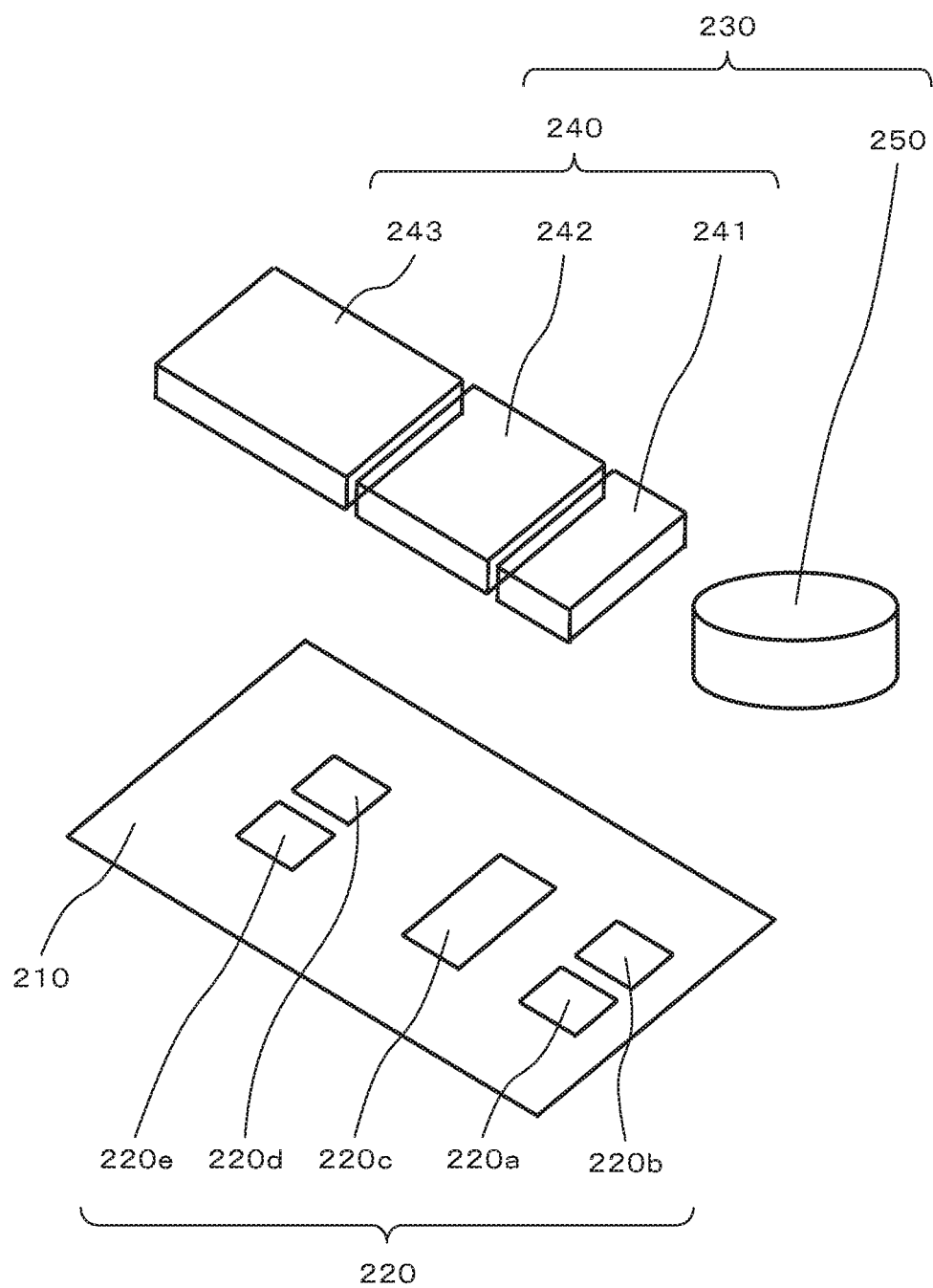
FIG. 3 is an exploded perspective view illustrating a configuration of heat sinks, the cooling structure and an electronic device (a device) according to the alternative exemplary embodiment (the second exemplary embodiment) of the present invention.

Another exemplary embodiment (a second exemplary embodiment) of the present invention will be described with reference to FIGS. 2 and 3. FIGS. 2 and 3 are a perspective view and an exploded perspective view, respectively, illustrating a configuration of a heat dissipating structure 240, a cooling structure 230 and an electronic device (a device) 200 according to this exemplary embodiment (the second exemplary embodiment).

The electronic device 200 according to this exemplary embodiment includes a substrate 210, heat generating elements 220, and a cooling structure 230. Since the substrate 210 is well known from the prior art, the substrate 210 will be only briefly described and a detailed description thereof will be omitted. The substrate 210 is made of a material such as phenol resin or epoxy resin and is formed into a plate. Heat generating elements 220 are disposed on one surface of the plate-shaped substrate 210.

The heat generating elements 220 are integrated circuits such as CPU, IC, LSI, or MPU, for example. A heat generating element 220c may be a CPU and heat generating elements 220a, 220b, 220d and 220e may be memories, for example. An example of a first heat generating element 220c may be assumed to be a CPU and examples of a second heat generating element 220d, 220e may be assumed to be memories. Alternatively, examples of the first heat generating element may be 220a and 220b, examples of the second heat generating element may be 220d and 220e, and the heat generating elements 220a, 220b, 220d and 220e may be assumed to be memories. The heat generating elements 220 generate heat when they are in operation. The heat dissipating structure 240 is placed on the heat generating elements 220 in order to dissipate heat generated by the heat generating elements 220.

The cooling structure 230 includes the heat dissipating structure 240 and an air blower unit 250. The heat dissipating structure 240 dissipates heat generated by the heat generating elements 220 and is made of metal that has a high thermal conductivity, such as aluminum, iron or copper. The heat dissipating structure 240 will be described later.

The air blower unit 250 is an axis flow fan, a blower fan or the like, for example, which is well known from the prior art and therefore will be only briefly described and detailed descriptions thereof will be omitted. The air blower unit 250 is disposed in a location from which air can be sent in the extending direction of the fins of the heat dissipating structure 240. In this exemplary embodiment, the air blower unit 250 is located near a side surface of the heat dissipating structure 240 along the direction of the width of the heat dissipating structure 240.

In this exemplary embodiment, the heat dissipating structure 240 includes a plurality of regions (a first heat sink 241, a second heat sink 242 and a third heat sink 243) that are arranged along the airflow direction A from the air blower unit 250. The heat dissipating structure 240 is formed in such a way that the plurality of regions are arranged in descending order of thermal resistance, from windward to leeward.

The thermal resistance of the heat dissipating structure 240 can be calculated as 1/(thermal conductivity×surface area of heat dissipating structure 240). The surface area of the heat dissipating structure 240 is the total of front and back surface areas of a plurality of fins. Therefore, in order to reduce the thermal resistance value, the heat dissipating structure 240 needs to be made of a material that has a high thermal conductivity or the total of front and back surface areas of the plurality of fins needs to be increased.

In the heat dissipating structure 240 in this exemplary embodiment, the length L1 of the first heat sink 241 located on the windward side along the airflow direction A is shorter than the lengths (L2 and L3) of the other heat sinks (the second heat sink 242 and the third heat sink 243). In the heat dissipating structure 240, the length L3 of the third heat sink 243 located on the leeward side along the airflow direction A is longer than the lengths (L1 and L2) of the other heat sinks (the first heat sink 241 and the second heat sink 243). In other words, the heat dissipating structure 240 is formed in such a way that the most-windward region has the shortest length along the airflow direction A among the plurality of regions. Further, the heat dissipating structure 240 is formed in such a way that the length of the most-leeward region along the airflow direction A is the longest. It can be therefore said that in the heat dissipating structure 240, regions closer to the leeward end have larger total of front and back surface areas of fins. This allows the heat dissipating structure 240 to have thermal resistance that decreases from windward to leeward, thereby enhancing the heat dissipation effect on the leeward side without increasing the number of parts.

According to this exemplary embodiment, an increase in the temperature on the leeward side of the heat dissipating structure 240 can be suppressed without increasing cost. While the heat dissipating structure 240 in this exemplary embodiment is formed in such a way that the regions are arranged in ascending order of length, from windward to leeward, along the airflow direction A, the heat dissipation structure 240 is not so limited; any configuration may be employed in which the regions are arranged in descending order of thermal resistance, from windward to leeward.

For example, a heat dissipating structure 240 may be formed in such a way as to increase in height toward the leeward end in the airflow direction A. Further, for example, a heat dissipating structure 240 may be formed in such a way as to widen toward the leeward end in the airflow direction A. Further, for example, a heat dissipating structure 240 may be formed in such a way as to have fins that increase in number toward the leeward end in the airflow direction A. Furthermore, for example, a heat dissipating structure 240 may be made of different materials. In this case, regions in the heat dissipating structure 240 that are closer to the leeward end in the airflow direction A may be made of materials having lower heat resistances.

Note that one example of the electronic device 200 of this exemplary embodiment is a PCIE-compliant card. PCIE-compliant cards are generally available in sizes such as full-size, short-size, and low-profile. The full-size PCIE-compliant card is specified as a height of 107 mm and a length of 312 mm. The short-size PCIE-compliant card is specified as a height of 107 mm and a length of 173 mm. "PCIE" is an abbreviation of "Peripheral Component Interconnect Express".

Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents. Further, it is noted that the inventor's intent is to retain all equivalents of the claimed invention even if the claims are amended during prosecution.

REFERENCE SINGS LIST

100 Electronic device
120 Heat generating element
130 Cooling structure
140 Heat dissipating structure
150 Air blower unit

The invention claimed is:

1. A heat dissipating structure including a plurality of regions along a direction of airflow from an air blower unit, wherein
the plurality of regions are arranged in a descending order of thermal resistance, from a windward side to a leeward side,
each region in the plurality of regions corresponds to at least one of a plurality of heat generating elements,
the each region is separated by a gap in the direction of airflow from an adjacent region in the plurality of regions, and
the gap is located above the heat generating elements in an area between two of the heat generating elements.

2. The heat dissipating structure according to claim 1, wherein the plurality of regions are arranged in ascending order of a length of each region, from the windward side to the leeward side, along the direction of airflow.

3. The heat dissipating structure according to claim 1, wherein the plurality of regions are arranged in ascending order of a height of each region, from the windward side to the leeward side, along the direction of airflow.

4. The heat dissipating structure according to claim 1, wherein the plurality of regions are arranged in ascending order of a number of fins in each region, from the windward side to the leeward side, along the direction of airflow.

5. The heat dissipating structure according to claim 1, wherein the plurality of regions are arranged in ascending order of a width of each region, from the windward side to the leeward side, along the direction of airflow.

6. The heat dissipating structure according to claim 1, wherein the plurality of regions are each made of different materials.

7. A heat dissipating structure comprising a first heat sink and a second heat sink which are arranged along a direction of airflow from an air blower unit, the second heat sink being located on a leeward side of the first heat sink, wherein
the second heat sink has a thermal resistance lower than the first heat sink,
the first heat sink is arranged so as to correspond to a first heat generating element and the second heat sink is arranged so as to correspond to a second heat generating element, and
the second heat sink has a greater length in the direction of the airflow than the first heat sink.

8. The heat dissipating structure according to claim 7, wherein
the first heat generating element is thermally coupled to the first heat sink;
the second heat generating element is thermally coupled to the second heat sink; and
the first heat generating element and the second heat generating element are heat generating elements different in kind.

9. The heat dissipating structure according to claim 8, wherein the first heat generating element is a CPU and the second heat generating element is a memory.

10. The heat dissipating structure according to claim 7, wherein
the first heat generating element is thermally coupled to the first heat sink;
the second heat generating element is thermally coupled to the second heat sink; and
the first heat generating element and the second heat generating element are memories.

11. A heat dissipating structure comprising a first heat sink and a second heat sink which are arranged along a direction of airflow from an air blower unit, the second heat sink being located on a leeward side of the first heat sink, wherein
the second heat sink has a thermal resistance lower than the first heat sink,
the first heat sink is arranged so as to correspond to a first heat generating element and the second heat sink is arranged so as to correspond to a second heat generating element, and the second heat sink on the leeward side has a greater height in the direction of airflow than the first heat sink.

12. The heat dissipating structure according to claim 7, wherein the second heat sink includes more fins than the first heat sink.

13. A heat dissipating structure comprising a first heat sink and a second heat sink which are arranged along a direction of airflow from an air blower unit, the second heat sink being located on a leeward side of the first heat sink, wherein
the second heat sink has a thermal resistance lower than the first heat sink,
the first heat sink is arranged so as to correspond to a first heat generating element and the second heat sink is arranged so as to correspond to a second heat generating element, and
the second heat sink is wider than the first heat sink.

14. The heat dissipating structure according to claim 7, wherein the first heat sink and the second heat sink are made of different materials.

15. A cooling structure comprising:
an air blower unit; and
a first heat sink and a second heat sink which are arranged along a direction of airflow from the air blower unit, the second heat sink being located on a leeward side of the first heat sink, wherein
the second heat sink has a thermal resistance lower than the first heat sink,
the first heat sink is arranged so as to correspond to a first heat generating element and the second heat sink is arranged so as to correspond to a second heat generating element, and
the second heat sink has a greater length in the direction of the airflow than the first heat sink.

16. A device comprising:
a heat generating element thermally coupled to the heat dissipating structure;
a first heat sink and a second heat sink which are arranged along a direction of airflow from the air blower unit, the second heat sink being located on a leeward side of the first heat sink, wherein
the second heat sink has a thermal resistance lower than the first heat sink,
the first heat sink is arranged so as to correspond to a first heat generating element and the second heat sink is arranged so as to correspond to a second heat generating element, and
the second heat sink has a greater length in the direction of the airflow than the first heat sink.

\* \* \* \* \*